United States Patent
Imamura et al.

(10) Patent No.: US 12,116,434 B2
(45) Date of Patent: Oct. 15, 2024

(54) WAFER CUP

(71) Applicant: DAIKIN INDUSTRIES, LTD., Osaka (JP)

(72) Inventors: Hitoshi Imamura, Osaka (JP); Eri Mukai, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 405 days.

(21) Appl. No.: 17/603,026

(22) PCT Filed: Feb. 28, 2020

(86) PCT No.: PCT/JP2020/008365
§ 371 (c)(1),
(2) Date: Oct. 12, 2021

(87) PCT Pub. No.: WO2020/213266
PCT Pub. Date: Oct. 22, 2020

(65) Prior Publication Data
US 2022/0195089 A1    Jun. 23, 2022

(30) Foreign Application Priority Data
Apr. 16, 2019 (JP) .................. 2019-077858

(51) Int. Cl.
*C08F 214/26* (2006.01)
*H01L 21/67* (2006.01)

(52) U.S. Cl.
CPC .... *C08F 214/267* (2013.01); *H01L 21/67023* (2013.01)

(58) Field of Classification Search
CPC ................ H01L 21/027; H01L 21/304; H01L 21/67023; H01L 21/67051; H01L 21/6715; C08J 2327/18; C08J 7/123; C08F 214/262; C08F 214/267; C08F 216/1408; B05C 11/08
See application file for complete search history.

(56) References Cited

U.S. PATENT DOCUMENTS

| | | |
|---|---|---|
| 2014/0287177 A1 | 9/2014 | Suda et al. |
| 2017/0225436 A1 | 8/2017 | Takahashi et al. |
| 2017/0282469 A1 | 10/2017 | Yamamura et al. |
| 2019/0375929 A1* | 12/2019 | Nishimura .............. C08L 27/22 |
| 2020/0048376 A1 | 2/2020 | Yamamoto et al. |

FOREIGN PATENT DOCUMENTS

| | | |
|---|---|---|
| JP | 10-030761 A | 2/1998 |
| JP | 11-297652 A | 10/1999 |
| JP | 4879186 B2 | 2/2012 |

(Continued)

OTHER PUBLICATIONS

International Search Report for PCT/JP2020/008365 dated May 26, 2020 (PCT/ISA/210).

(Continued)

*Primary Examiner* — Yan Lan
(74) *Attorney, Agent, or Firm* — Sughrue Mion, PLLC

(57) ABSTRACT

A wafer cup including a copolymer containing a tetrafluoroethylene unit and a fluoro(alkyl vinyl ether) unit. A water contact angle of at least a part of an inner surface of the wafer cup is 80 degrees or less.

3 Claims, 2 Drawing Sheets

(56) References Cited

FOREIGN PATENT DOCUMENTS

| | | |
|---|---|---|
| JP | 2012-054269 A | 3/2012 |
| JP | 2013-071341 A | 4/2013 |
| JP | 2015-138755 A | 7/2015 |
| JP | 2016-037597 A | 3/2016 |
| JP | 2016-056363 A | 4/2016 |
| WO | 2018/066706 A1 | 4/2018 |

OTHER PUBLICATIONS

International Preliminary Report of Patentability (with translation of the Written Opinion) dated Sep. 28, 2021, issued by the International Bureau in application No. PCT/JP2020/008365.

* cited by examiner

WAFER CUP

CROSS REFERENCE TO RELATED APPLICATIONS

This application is a National Stage of International Application No. PCT/JP2020/008365 filed Feb. 28, 2020, claiming priority based on Japanese Application No. 2019-077858 filed Apr. 16, 2019.

TECHNICAL FIELD

The present disclosure relates to a wafer cup used in a semiconductor manufacturing process.

BACKGROUND ART

The semiconductor manufacturing process usually includes the step of treating a wafer with water or a chemical solution. As an apparatus used in such a treatment step, for example, Patent Document 1 discloses a semiconductor cleaning apparatus equipped with a wafer spin base such as a rotary table that can be rotated, with a wafer to be cleaned being secured to the upper surface, wherein the wafer spin base is disposed in a wafer cup composed of an open-top container.

RELATED ART

Patent Document

Patent Document 1: Japanese Patent Laid-Open No. 2012-54269

SUMMARY OF THE INVENTION

Problem to be Solved by the Invention

An object of the present disclosure is to provide a wafer cup with which triboelectrification and peeling electrification are unlikely occur.

Means for Solving the Problem

The present disclosure provides a wafer cup comprising a copolymer comprising a tetrafluoroethylene unit and a fluoro(alkyl vinyl ether) unit, wherein a water contact angle of at least a part of an inner surface of the wafer cup is 80 degrees or less.

The content of the fluoro(alkyl vinyl ether) unit in the copolymer is preferably 3.5 to 7.0% by mass based on all monomer units.

The melt flow rate of the copolymer at 372° C. is preferably 1 to 30 g/10 min.

Effects of Invention

According to the present disclosure, a wafer cup with which triboelectrification and peeling electrification are unlikely occur can be provided.

DESCRIPTION OF EMBODIMENTS

Below, specific embodiments of the present disclosure will now be described in detail, but the present disclosure is not limited to the following embodiments.

The wafer cup of the present disclosure comprises a copolymer comprising a tetrafluoroethylene unit and a fluoro(alkyl vinyl ether) unit, wherein a water contact angle of at least a part of an inner surface of the wafer cup is 80 degrees or less.

Figure 1:
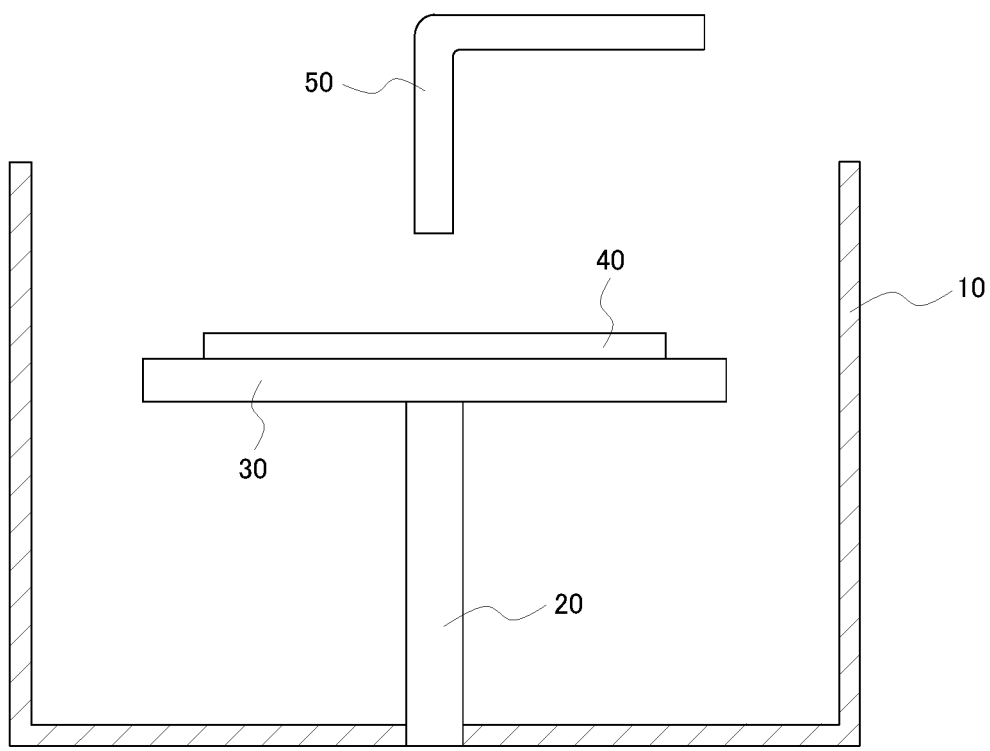
FIG. 1 is a cross-sectional view of a wafer cup and a wafer treating apparatus to which the wafer cup is applied according to one embodiment of the present disclosure.

FIG. 1 is a cross-sectional view of a wafer treating apparatus according to one embodiment of the present disclosure. As shown in FIG. 1, the wafer treating apparatus according to one embodiment of the present disclosure is an apparatus for treating a wafer 40 by holding the wafer 40 by a chuck mechanism or the like on a wafer spin base 30 that can be rotated by a rotation mechanism 20, and feeding water or a chemical solution from a nozzle 50 to the wafer 40 while rotating the wafer 40 by the rotation of the wafer spin base 30 resulting from the action of the rotation mechanism 20. While FIG. 1 depicts an exemplary configuration having one nozzle 50 for feeding water or a chemical solution, the number of nozzles 50 is not limited and may be 2 or more, and the nozzle 50 may be disposed in a position such that water or a chemical solution is fed to the lower surface side of the wafer 40.

In the wafer treating apparatus according to one embodiment of the present disclosure, a wafer cup 10 is provided so as to surround the wafer spin base 30 and the wafer 40 as shown in FIG. 1. In the wafer treating apparatus according to one embodiment of the present disclosure, the wafer spin base 30 and the wafer 40 are surrounded by the wafer cup 10, and, thus, when a part of water or a chemical solution fed to the wafer 40 is scattered from the wafer spin base 30 and the wafer 40, the wafer cup 10 acts as a scatter suppressing member for suppressing scattering of water or a chemical solution to the outside.

In one embodiment of the present disclosure, the wafer cup of the present disclosure is suitably used as the wafer cup 10.

The wafer cup 10 shown in FIG. 1 and the wafer cup disclosed in Patent Document 1 are generally large in size and required to have excellent chemical resistance and, thus, produced by cutting a block of polytetrafluoroethylene.

However, cutting a block of polytetrafluoroethylene may require a significant temporal burden and economic burden, and thus a novel material and production method are sought. In a known method for producing a fluoropolymer molded article, a melt-processable fluoropolymer is melt-molded.

On the other hand, it was found that in the case of using a large molded article obtained by molding a fluoropolymer as a wafer cup, the wafer cup becomes electrically charged through triboelectrification and peeling electrification with droplets when scattered water, chemical solution, or the like adheres to the wafer cup, forms droplets, and flows the surface of the wafer cup. Specifically, it was found that when droplets adhering to the wafer cup surface move on the wafer cup surface (for example, when droplets flow down the wafer cup surface), such movement causes triboelectrification and peeling electrification of the wafer cup and the wafer cup becomes electrically charged. When a fluoropolymer-containing wafer cup is electrically charged even once, it is not easy to discharge the electrical charge. Accordingly, problems that are presumed to be caused by a charged wafer cup may occur, e.g., droplets scattering toward a wafer cup return in an electrostatically charged state back to a wafer due to electrostatic repulsion and cause problems in semiconductor devices. Therefore, countermeasures against static electricity in a production line in a semiconductor manufacturing process are important issues that affect the "yield" of semiconductor device manufacture.

As a method of making triboelectrification and peeling electrification unlikely occur, a method involving a carbon-based antistatic agent can be considered, but the use of a carbon-based antistatic agent is problematic by causing contamination due to elution.

On the other hand, the wafer cup of the present disclosure is a molded article to be used in an application for surrounding a wafer in a wafer treating apparatus in which water or a chemical solution is fed to a wafer while rotating the wafer, for example, as in the wafer cup 10 shown in FIG. 1, and is a molded article comprising a copolymer comprising a tetrafluoroethylene unit and a fluoro(alkyl vinyl ether) unit, wherein the water contact angle of at least a part of the inner surface of the wafer cup (at least a part of the surface of the wafer cup surrounding the wafer in the embodiment of FIG. 1) is adjusted to 80 degrees or less. The wafer cup of the present disclosure, since the water contact angle of at least a part of the inner surface of which is adjusted to 80 degrees or less, unlikely undergoes triboelectrification and peeling electrification, and thus can suitably solve the above problems.

The water contact angle of the wafer cup of the present disclosure is 80 degrees or less and, since triboelectrification and peeling electrification can be further suppressed, is preferably 70 degrees or less and more preferably 60 degrees or less. The lower limit is not limited and, from the viewpoint of the ease of production, is preferably 40 degrees or more. The water contact angle may be the water contact angle of at least a part of the surface surrounding a wafer, may be the water contact angle of the entirety of the surface surrounding a wafer, or may be the water contact angle of a part of the surface surrounding a wafer, to which water or a chemical solution scattering from the wafer may adhere.

When the wafer cup of the present disclosure is the wafer cup 10 used in the wafer treating apparatus shown in FIG. 1, the water contact angle may be the water contact angle of the entirety of the surface surrounding the wafer spin base 30 and the wafer 40, or may be the water contact angle of a part of the surface surrounding the wafer spin base 30 and the wafer 40, to which water or a chemical solution scatting from the wafer may adhere.

Herein, the water contact angle is measured with a contact angle meter.

The wafer cup of the present disclosure comprises a copolymer (hereinafter referred to as a TFE/FAVE copolymer (or PFA)) comprising a tetrafluoroethylene unit (a TFE unit) and a fluoro(alkyl vinyl ether) unit (a FAVE unit).

The TFE/FAVE copolymer is preferably a melt-fabricable fluororesin. In the present disclosure, melt-fabricable means that the polymer can be melted and processed by using a conventional processing device such as an extruder or an injection molding machine. Accordingly, the melt-fabricable fluororesin usually has a melt flow rate of 0.01 to 500 g/10 min as measured by the measuring method described below.

The content of a monomer unit based on FAVE in the TFE/FAVE copolymer is preferably 1.0 to 10% by mass, and is more preferably 2.0% by mass or more, even more preferably 3.5% by mass or more, and particularly preferably 4.0% by mass or more, and more preferably 8.0% by mass or less, even more preferably 7.0% by mass or less, particularly preferably 6.5% by mass or less, and most preferably 6.0% by mass or less, based on all monomer units. The amount of a monomer unit based on FAVE is measured by $^{19}$F-NMR method.

FAVE constituting the FAVE unit may be at least one selected from the group consisting of a monomer represented by general formula (1):

$$CF_2=CFO\ (CF_2CFY^1O)_p-(CF_2CF_2CF_2O)_q-R^f \qquad (1)$$

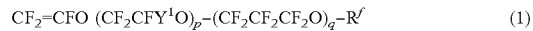

(wherein $Y^1$ represents F or $CF_3$, $R^f$ represents a perfluoroalkyl group having 1 to 5 carbon atoms, p represents an integer of 0 to 5, and q represents an integer of 0 to 5) and a monomer represented by general formula (2):

$$CFX=CXPCF_2OR^2 \qquad (2)$$

(wherein X is the same or different and represents H, F, or $CF_3$, and $R^2$ is a linear or branched fluoroalkyl group having 1 to 6 carbon atoms and optionally containing 1 to 2 atoms of at least one selected from the group consisting of H, Cl, Br, and I, or is a cyclic fluoroalkyl group having 5 or 6 carbon atoms and optionally containing 1 to 2 atoms of at least one selected from the group consisting of H, Cl, Br, and I).

Among them, FAVE is preferably a monomer represented by general formula (1), more preferably at least one selected from the group consisting of perfluoro(methyl vinyl ether), perfluoro(ethyl vinyl ether), and perfluoro(propyl vinyl ether) (PPVE), and even more preferably PPVE.

The TFE/FAVE copolymer is not limited, and is preferably a copolymer having a molar ratio of a TFE unit to a FAVE unit (a TFE unit/a FAVE unit) of 70/30 or more and less than 99/1. A more preferable molar ratio is 70/30 or more and 98.9/1.1 or less, and an even more preferable molar ratio is 80/20 or more and 98.9/1.1 or less. When the ratio of a TFE unit is excessively small, the mechanical properties tend to be impaired, and when excessively large, the melting point is excessively high, and moldability tends to be impaired.

The TFE/FAVE copolymer is also preferably a copolymer in which a monomer unit derived from a monomer copolymerizable with TFE and FAVE is 0.1 to 10 mol %, and the TFE unit and the FAVE unit are 90 to 99.9 mol % in total.

Examples of the monomer copolymerizable with TFE and FAVE include hexafluoropropylene (HFP), a vinyl monomer represented by $CZ^3Z^4=CZ^5(CF_2)_nZ^6$ (wherein $Z^3$, $Z^4$, and $Z^5$ are the same or different and represent H or F, $Z^6$ represents H, F, or Cl, and n represents an integer of 2 to 10), and an alkyl perfluorovinyl ether derivative represented by $CF_2=CF-OCH_2-Rf^7$ (wherein $Rf^7$ represents a perfluoroalkyl group having 1 to 5 carbon atoms). Among them, HFP is preferable.

The TFE/FAVE copolymer is preferably at least one selected from the group consisting of a copolymer composed solely of a TFE unit and a FAVE unit and the above-described TFE/HFP/FAVE copolymer, and is more preferably a copolymer composed solely of a TFE unit and a FAVE unit.

The melting point of the TFE/FAVE copolymer is preferably 280 to 322° C., and is more preferably 290° C. or higher and more preferably 315° C. or lower. The melting point can be measured with a differential scanning calorimeter (DSC).

The glass transition temperature (Tg) of the TFE/FAVE copolymer is preferably 70 to 110° C., and is more preferably 80° C. or higher and more preferably 100° C. or lower. The glass transition temperature can be measured by dynamic viscoelasticity measurement.

The melt flow rate (MFR) of the TFE/FAVE copolymer at 372° C. is preferably 0.1 to 100 g/10 min, and is more preferably 0.5 g/10 min or more, and even more preferably 1 g/10 min or more, and is more preferably 80 g/10 min or less, even more preferably 40 g/10 min or less, and particularly preferably 30 g/10 min or less. MFR is a value obtained as the mass (g/10 min) of a polymer flowing out from a nozzle having an inner diameter of 2.1 mm and a length of 8 mm at 372° C. at a load of 5 kg in 10 minutes in accordance with ASTM D 1238 using a melt indexer (manufactured by Yasuda Seiki Seisakusho Ltd.).

The TFE/FAVE copolymer preferably has 0 to 1000 functional groups in total per $10^6$ carbon atoms because molding defects resulting from foaming resulting from thermal decomposition of functional groups unlikely occur. The number of functional groups is more preferably 0 to 700, more preferably 500 or less, and even more preferably 300 or less per $10^6$ carbon atoms.

The functional group is a functional group that is present at a main chain terminal or a side chain terminal of the TFE/FAVE copolymer, and a functional group that is present in the main chain or in a side chain. The functional group is preferably at least one selected from the group consisting of —CF=$CF_2$, —$CF_2$H, —COF, —COOH, —$COOCH_3$, —$CONH_2$, and —$CH_2$OH.

Infrared spectroscopy can be used to identify the kind of functional group and measure the number of functional groups.

Specifically, the number of functional groups is measured by the following method. First, the TFE/FAVE copolymer is melted at 330 to 340° C. for 30 minutes and compression-molded to create a film having a thickness of 0.25 to 0.3 mm. This film is analyzed by Fourier transform infrared spectroscopy to obtain the infrared absorption spectrum of the TFE/FAVE copolymer and obtain a spectral difference from a base spectrum of a completely fluorinated copolymer having no functional group. From the absorption peak of a specific functional group appearing in the spectral difference, the number N of functional groups per $1\times10^6$ carbon atoms in the TFE/FAVE copolymer is calculated according to the following formula (A).

$$N = I \times K/t \quad (A)$$

I: Absorbance
K: Correction coefficient
t: Film thickness (mm)

For reference, Table 1 shows the absorption frequencies, molar absorption coefficients, and correction coefficients of functional groups in the present disclosure. The molar adsorption coefficients are determined from the FT-IR measurement data of a low molecular weight model compound.

TABLE 1

| Functional Group | Absorption Frequency (cm$^{-1}$) | Molar Extinction Coefficient (l/cm/mol) | Correction Factor | Model Compound |
|---|---|---|---|---|
| —COF | 1883 | 600 | 388 | $C_7F_{16}$COF |
| —COOH free | 1815 | 530 | 439 | H(CF$_2$)$_6$COOH |
| —COOH bonded | 1779 | 530 | 439 | H(CF$_2$)$_6$COOH |
| —COOCH$_3$ | 1795 | 680 | 342 | $C_7F_{15}$COOCH$_3$ |
| —CONH$_2$ | 3436 | 506 | 460 | $C_7F_{15}$CONH$_2$ |
| —CH$_2$OH, —OH | 3648 | 104 | 2236 | $C_7F_{15}$CH$_2$OH |
| —CF$_2$H | 3020 | 8.8 | 26485 | H(CF$_2$CF$_2$)$_3$CH$_2$OH |
| —CF=CF$_2$ | 1795 | 635 | 366 | CF$_2$=CF$_2$ |

The absorption frequencies of —$CH_2CF_2H$, —$CH_2COF$, —$CH_2COOH$, —$CH_2COOCH_3$, and —$CH_2CONH_2$ are smaller by several tens of Kaisers (cm$^{-1}$) than the absorption frequencies of —$CF_2$H, —COF, —COOH free and —COOH bonded, —$COOCH_3$, and —$CONH_2$ shown in the table, respectively.

Accordingly, for example, the number of —COF functional groups is the sum of the number of functional groups obtained from the absorption peak at an absorption frequency of 1883 cm$^{-1}$ derived from —$CF_2$COF and the number of functional groups obtained from the absorption peak at an absorption frequency of 1840 cm$^{-1}$ derived from —$CH_2$COF.

The number of functional groups may be the total number of —CF=$CF_2$, —$CF_2$H, —COF, —COOH, —$COOCH_3$, —$CONH_2$, and —$CH_2$OH.

The functional group is introduced into the TFE/FAVE copolymer by, for example, a chain transfer agent or a polymerization initiator used when producing the TFE/FAVE copolymer. For example, when alcohol is used as a chain transfer agent, or when a peroxide having a —$CH_2$OH structure is used as a polymerization initiator, —$CH_2$OH is introduced into a main chain terminal of the TFE/FAVE copolymer. By polymerizing a monomer having a functional group, the functional group is introduced into a side chain terminal of the TFE/FAVE copolymer.

The TFE/FAVE copolymer can be produced by, for example, a conventionally known method in which monomers that are the constituent units thereof and additives such as a polymerization initiator are suitably mixed, and emulsion polymerization or suspension polymerization is performed.

The wafer cup of the present disclosure may contain components other than the TFE/FAVE copolymer as necessary. Examples of other components include additives such as cross-linking agents, heat stabilizers, foaming agents, foam nucleating agents, antioxidants, surfactants, photopolymerization initiators, wear preventing agents, and surface modifiers.

In the present disclosure, the size of the wafer cup is not limited, and may be large. The wafer cup of the present disclosure may have a larger projected area than, for example, a wafer (a semiconductor wafer) having a diameter of at least 300 mm or at least 450 mm. The projected area of the wafer cup of the present disclosure is preferably 1000 cm$^2$ or more and more preferably 1100 cm$^2$ or more, and may be 5000 cm$^2$ or less. The shape of the wafer cup having a projected area within the above range is not limited, and may be any shape capable of surrounding a wafer, such as a cylindrical, bowl, box, or basket shape, and it is sufficient that the maximum projected area, among the projected areas of the wafer cup as viewed from various directions, is within the above range. Also, when the wafer cup of the present disclosure is an injection-molded article obtained by injection molding, the projected area in the injection direction is preferably within the above range. The projected area in the injection direction is the area that can be seen when the injection-molded article is viewed from the nozzle direction of an injection molding machine, i.e., the projected area in the nozzle direction. Also, the injection-molded article having a projected area in the injection direction within the above range preferably has an injection area diffusion ratio of 3000 or more. The injection area ratio is the injection area diffusion ratio in the direction orthogonal to the injection direction, i.e., the ratio of the opening area at the end of the nozzle part to the projected area of the injection-molded article.

The wafer cup of the present disclosure is preferably a wafer cup that surrounds a wafer in a wafer treating apparatus that feeds water or a chemical solution to the wafer while rotating the wafer and, thus, can be an injection-molded article having a tubular portion capable of surrounding, for example, a wafer (a semiconductor wafer) having a diameter of at least 300 mm or at least 450 mm. The tubular portion of the injection-molded article is also preferably a portion that surrounds a holding means such as a turn base, a spin base, or a spin chuck for holding a wafer. In one embodiment shown in FIG. 1, the tubular portion of the wafer cup 10 composed of the wafer cup of the present disclosure surrounds the wafer spin base 30 and the wafer 40. In one embodiment shown in FIG. 1, the wafer cup 10 is in a cylindrical shape having a cylindrical portion with a closed bottom, but the wafer cup 10 is not limited to such a shape and may have a bowl, box, basket, or like shape.

In the present disclosure, examples of the wafer treating apparatus include, but are not limited to, a semiconductor cleaning apparatus that cleans a wafer with water or a chemical solution, a semiconductor manufacturing apparatus that applies a resist to form a resist film, and a semiconductor manufacturing apparatus that develops a resist film, and in each of these apparatuses, water or a chemical solution is fed to a wafer while rotating the wafer. Alternatively, by rotating the wafer, water or a chemical solution on the wafer is shaken off to dry the wafer. Accordingly, water or a chemical solution will scatter around the wafer. The wafer cup of the present disclosure can be used as the wafer cup 10 shown in FIG. 1, and can be provided around a wafer so as to suppress scattering of water or a chemical solution. The wafer cup of the present disclosure may be referred to as a cup guard, a splash guard, or the like. Triboelectrification and peeling electrification unlikely occur with the wafer cup of the present disclosure, and, thus, the wafer cup unlikely charges a wafer or causes charged droplets to bounce back to the wafer, for example, even when the wafer cup is provided so as to surround the wafer. Accordingly, the wafer cup of the present disclosure can greatly contribute to improving the yield of semiconductor device manufacture. In particular, triboelectrification and peeling electrification are charging resulting from movement of droplets that occurs when droplets adhering to the surface of a wafer cup move on the surface of the wafer cup, but, according to the wafer cup of the present disclosure, triboelectrification and peeling electrification unlikely occur, and, as a result, the above problems can be effectively solved.

In the present disclosure, the wafer treating apparatus that feeds water or a chemical solution to a wafer while rotating the wafer may be an apparatus for carrying out pre-processing of a semiconductor, and the wafer cup of the present disclosure can be used as, for example, a component to be provided in an apparatus for carrying out pre-processing of a semiconductor. Examples of the pre-processing of a semiconductor include the following processing procedures:

a. "washing processing" of washing a silicon wafer that serves as a substrate;

b. "film forming processing" of forming a thin film that serves as a circuit material on the silicon wafer;

c. "resist applying processing" of uniformly applying a photoresist (a sensitizing solution);

d. "exposing processing" of transferring a circuit pattern;

e. "developing processing" of melting the photoresist of an exposed part;

f. "etching processing" of removing an underlying thin film exposed by a chemical solution or ions;

g. "ion-injecting processing" of injecting impurities such as phosphorus to impart electrical properties to silicon; and h. "peeling processing" of removing an unnecessary photoresist.

To carry out each of the above processing procedures, water or a chemical solution is fed to a wafer while rotating the wafer to treat the wafer, and, thus, the wafer cup of the present disclosure can be suitably used as a wafer cup for surrounding a wafer in an apparatus used in each of such processing procedures.

The method for producing the wafer cup of the present disclosure is not limited, and the wafer cup can be suitably produced by a wafer cup production method described below.

The wafer cup production method of the present disclosure is a method for producing a wafer cup comprising a copolymer (a TFE/FAVE copolymer) comprising a TFE unit and a FAVE unit, and comprises the step of performing a plasma treatment on at least a part of the surface thereof. In the wafer cup production method of the present disclosure, performing a plasma treatment enables a surface having a small water contact angle to be formed. Thus, the plasma treatment may be performed on the entire surface thereof. Alternatively, when the wafer cup of the present disclosure is used as a wafer cup for surrounding a wafer or when used as the wafer cup 10 shown in FIG. 1 in a wafer treating apparatus that feeds water or a chemical solution to a wafer while rotating the wafer, the plasma treatment may be performed on at least a part of the surface surrounding the wafer. Moreover, the plasma treatment may be performed on the entirety of the surface surrounding a wafer, or may be performed on a part of the surface surrounding a wafer, to which water or a chemical solution scattering from the wafer may adhere.

In the production method of the present disclosure, the use of the TFE/FAVE copolymer provides the effect that not only the water contact angle of the obtained wafer cup can be sufficiently lowered, but also the small water contact angle can be maintained for a long period of time. Although the reason therefor is not clear, it is considered that the plasma treatment not only produces a hydrophilic functional group on the surface of the wafer cup, but also crosslinks polymer molecules present in the vicinity of the surface and anchors the produced hydrophilic functional group to the surface of the wafer cup. Usually, a polar functional group produced on the surface has a greater surface free energy than bulk or air (because, although the dispersion force component is decreased, the dipole force component and the hydrogen bond component are increased, and the total is increased), and is more stable in terms of surface free energy when submerged inside the wafer cup, and it is thus considered that a molecular motion called internal inversion of the polar group occurs. In particular, in the case of a semi-crystalline polymer such as the TFE/FAVE copolymer, when crystallinity is low, the polymer chain in the non-crystalline portion is loose and likely has molecular motion, and thus internal inversion also likely occurs. It is inferred that in the production method of the present disclosure, by using the TFE/FAVE copolymer and adopting specific plasma treatment conditions, polymer molecules on the surface are crosslinked, the molecular motion of a hydrophilic functional group produced on the surface is suppressed, and thus the small water contact angle is retained for a long period of time.

On the other hand, it is inferred that when other perfluoropolymers that do not contain a FAVE unit, such as polytetrafluoroethylene (PTFE) and a TFE/HFP copolymer (FEP), are used, although they are similarly perfluoropolymers, the crosslinking of polymer molecules does not proceed smoothly, and a hydrophilic functional group, even when generated, disappears promptly.

The TFE/FAVE copolymer for use in the production method of the present disclosure may be the same copolymer as the TFE/FAVE copolymer contained in the wafer cup of the present disclosure, and the same copolymer as the TFE/FAVE copolymer contained in the wafer cup of the present disclosure is suitable.

In order to form a surface having a smaller water contact angle, a TFE/FAVE copolymer having a specific content of a FAVE unit is preferably used. The content of a FAVE-based monomer unit in the TFE/FAVE copolymer is preferably 1.0 to 10% by mass, and is more preferably 2.0% by mass or more, even more preferably 3.5% by mass or more, and particularly preferably 4.0% by mass or more, and is more preferably 8.0% by mass or less, even more preferably 7.0% by mass or less, particularly preferably 6.5% by mass or less, and most preferably 6.0% by mass or less, based on all monomer units.

In order to form a surface having a smaller water contact angle, a TFE/FAVE copolymer having a functional group is preferably used. It is inferred that by using a TFE/FAVE copolymer having a functional group, introduction of a hydrophilic functional group and a crosslinking reaction by the plasma treatment proceed smoothly. It is also inferred that, by introducing a hydrophilic functional group and crosslinking polymer molecules present in the vicinity of the surface of the wafer cup, the hydrophilic functional group can be maintained for a long period of time. In this case, the number of functional groups is preferably 1 or more.

A functional group that the TFE/FAVE copolymer for use in the production method of the present disclosure may have may be the same functional group as that of the TFE/FAVE copolymer contained in the wafer cup of the present disclosure, and the same functional group as that of the TFE/FAVE copolymer contained in the wafer cup of the present disclosure is suitable. Also, the number of functional groups may be the same as the number of functional groups in the TFE/FAVE copolymer contained in the wafer cup of the present disclosure.

The plasma treatment in the production method of the present disclosure can be performed by applying a voltage across discharge electrodes while introducing gas into the gap between a molded article that will constitute the wafer cup and the discharge electrodes, and subjecting the surface of the molded article that will constitute the wafer cup to a plasma irradiation treatment by plasma gas generated between the molded article and the discharge electrodes.

As for the plasma treatment in the production method of the present disclosure, a vacuum plasma treatment or an atmospheric pressure plasma treatment is preferable because a surface having a smaller water contact angle can be efficiently formed, and an atmospheric pressure plasma treatment is more preferable because it can be conveniently performed in a short period of time at normal pressure, the discharge state is highly stable and homogeneous, and the spatial uniformity of a generated radical is high.

As for the treatment time of the atmospheric pressure plasma treatment, the lower limit thereof is preferably 5 seconds or more and more preferably 10 seconds or more because a surface having a smaller water contact angle can be efficiently formed, and the upper limit is preferably 50 seconds or less, more preferably less than 50 seconds, even more preferably 45 seconds or less, yet more preferably 40 seconds or less, further preferably 35 seconds or less, particularly preferably 30 seconds or less, and most preferably 25 seconds or less. On the other hand, in the case of vacuum plasma, the treatment time is about several tens of seconds to 10 minutes although it varies according to the gas species, degree of vacuum, chamber size, electrode distance, and the like.

In the production method of the present disclosure, the plasma treatment is preferably performed on the molded article heated to a surface temperature of 150° C. or higher. Herein, the surface temperature during the plasma treatment refers to the maximum temperature of the surface of the molded article during plasma irradiation. When the surface temperature during the plasma treatment is excessively low, the contact angle of the obtained wafer cup cannot be sufficiently lowered, or the molecular mobility of polymer molecules present in the vicinity of the surface of the wafer cup cannot be sufficiently increased, thus the crosslinking reaction of polymer molecules in the vicinity of the surface cannot be promoted, and, accordingly, the small water contact angle cannot be maintained for a long period of time.

In the production method of the present disclosure, the surface temperature of the molded article to be subjected to the plasma treatment can be measured with a thermolabel manufactured by NiGK Corporation.

The upper limit of the surface temperature during the plasma treatment is preferably the melting point of the TFE/FAVE copolymer or lower from the viewpoint of suppressing thermal deformation of the molded article that will constitute the wafer cup. The surface temperature during the plasma treatment is more preferably 155° C. or higher, and more preferably 280° C. or lower and even more preferably 240° C. or lower. When the surface temperature during the plasma treatment is excessively high, the shape of the obtained wafer cup may be impaired.

Since PTFE is not melt-fabricable, the shape of the molded article does not significantly change even when the surface is heated to a very high temperature. Accordingly, by taking advantage of this characteristic of PTFE, only the surface is suitably melted and can be smoothed by heating the surface to a very high temperature, for example, when performing plasma treatment on a PTFE molded article having surface irregularities. On the other hand, since the TFE/FAVE copolymer is usually melt-fabricable, the original shape of the molded article may be impaired when the surface temperature during the plasma treatment is very high.

The method for controlling the surface temperature during the plasma treatment is not limited, and examples include a method involving controlling the temperature by plasma treatment conditions and a method involving controlling the temperature by an external heating facility. For example, when atmospheric pressure plasma treatment is used, the temperature can be spontaneously increased to a desired temperature range by adjusting the power density and the treatment time. When the molded article of the TFE/FAVE copolymer is subjected to atmospheric pressure plasma treatment for an excessively long period of time, the temperature is spontaneously increased to a temperature above the melting point, and the shape of the molded article may be impaired. Also, when pulse frequency modulation is used or vacuum plasma treatment is used, the surface temperature of the molded article is unlikely increased by the plasma treatment, and it is thus suitable to use a method involving performing the plasma treatment after increasing the surface temperature of the molded article to 140 to 240° C. by using an external heating facility, a method involving providing a heating means in a plasma treatment apparatus to perform heating, or the like. Examples of the heating means include a thermal heater, a heating-plate heater including an electric heating coil, and a halogen lamp.

The structure of electrodes used in the plasma treatment is not limited, and a structure suitable for the shape of the wafer cup to be obtained is preferable. The material of the high-voltage-side electrode and the ground-side electrode is not limited as long as it is a conductive material, examples in the case of metal include alloys such as stainless steel, brass, carbon steel and super steel as well as copper and aluminum, and these can be used singly or as a suitable combination. Alternatively, a material can be used that is obtained by coating the surface of non-conductive plastic, ceramic, or the like with copper, gold, a metal-oxide transparent conductive material, or the like for conductive treatment.

A reactive gas, or a mixed gas of a reactive gas and an excitation gas, can be used in the plasma treatment. Examples of the reactive gas include air, hydrogen, oxygen, ammonia, water vapor, and methane. Examples of the excitation gas include argon, helium, and nitrogen. Examples of the mixed gas include a mixed gas of oxygen gas and argon gas, and a mixed gas of oxygen gas and nitrogen gas. The volume ratio of reactive gas to excitation gas (reactive gas/excitation gas) may be in the range of 0.5/100 to 1.5/100. The oxygen concentration in the gas used may be in the range of 0.0005 to 0.3% by volume.

In particular, when oxygen gas is used, it can be expected that a hydrophilic functional group is generated on the surface of the molded article, and the water contact angle is sufficiently lowered. However, when the amount of oxygen based on that of the excitation gas such as helium gas or argon gas is excessive, the amount of power for maintaining discharge may be increased. A large amount of power may damage the surface of the molded article, and also increase the water contact angle. Accordingly, when using a mixed gas of oxygen gas and excitation gas in the plasma treatment, the volume ratio of oxygen gas to excitation gas (oxygen gas/excitation gas) is preferably in the range of 0.5/100 to 1.5/100.

It has been elucidated by emission spectrometry that helium gas as excitation gas is excited to a high energy level in plasma. Thus, activated He and $O_2$ react, a process gas such as oxygen is efficiently dissociated, and atomic oxygen can be easily generated (the penning effect).

The plasma treatment may be performed in a batch-wise manner, or in a continuous manner such as a treatment involving a conveyor mechanism.

Next, the treatment conditions when atmospheric pressure plasma treatment is used will now be described. Examples of the reaction apparatus used in the atmospheric pressure plasma treatment include a flow tube type reaction apparatus involving external electrodes and a bell jar type reaction apparatus involving internal electrodes.

The voltage frequency of a high-frequency power source used in the atmospheric pressure plasma treatment is preferably 50 Hz to 2.45 GHz. Also, 13.56 MHz is recommended as a high frequency that stably generates a uniform plasma space. The power density per unit area of an electrode is usually 5 to 50 W/cm$^2$ and preferably 10 to 30 W/cm$^2$, and when the molded article is heated at a certain level of high voltage, there is a tendency that the crosslinking reaction of polymer molecules likely proceeds. The pressure during the atmospheric pressure plasma treatment may be in the range of 500 to 1300 hPa (375 to 975 torr).

The distance between the molded article and the electrodes used in the atmospheric pressure plasma treatment is preferably 0.5 to 5 mm and more preferably 1 to 5 mm because the desired effect is obtained even at a relatively low voltage, and excellent safety and economy are obtained as well.

The gas flow rate in the atmospheric pressure plasma treatment may be 50 to 500 cc/min (normal pressure), and more preferably 10 to 400 cc/min (normal pressure).

Next, treatment conditions when vacuum plasma treatment is used will now be described. The voltage frequency used in the vacuum plasma treatment is preferably 5 Hz to 15 MHz. The vacuum apparatus used in the vacuum plasma treatment is preferably a rotary pump because of its efficiency. The pressure during the vacuum plasma treatment is usually 0.01 to 10 Torr (1.3 to 1330 Pa) and preferably 0.1 to 2 Torr (13.3 to 266 Pa) because discharge is stable, and a sufficient treatment speed is obtained.

The gas flow rate in the vacuum plasma treatment may be 5 to 50 cc/min (normal pressure). The gas flow rate can be regulated by a needle valve. Other treatment conditions may be the same as preferable treatment conditions of the atmospheric pressure plasma treatment.

The production method of the present disclosure preferably further comprises the step of obtaining a molded article that will constitute the wafer cup by molding the TFE/FAVE copolymer. It is preferable that the step of obtaining a molded article is performed before the step of performing the plasma treatment.

The method for molding the TFE/FAVE copolymer may be a method in which the TFE/FAVE copolymer is melted by being heated to the melting point or higher, and then molded. The method for molding the TFE/FAVE copolymer is not limited, and examples include known methods such as extrusion, injection molding, transfer molding, inflation molding, and compression molding. These molding methods may be suitably selected according to the shape of the wafer cup to be obtained.

Examples of the method for molding the TFE/FAVE copolymer include known methods such as extrusion, injection molding, transfer molding, inflation molding, and compression molding. Among these molding methods, injection molding is preferable because a large wafer cup can be easily produced.

In the production method of the present disclosure, when the molded article that will constitute the wafer cup is to be obtained by injection molding, an injection-molded article is obtained by injection molding, then the injection-molded article is supplied to a plasma treatment apparatus, and a plasma treatment is performed. Examples of known plasma treatment methods when performing a plasma treatment include a method for performing a plasma treatment under atmospheric pressure using an atmospheric pressure plasma treatment apparatus (e.g., Japanese Patent Laid-Open No. 5-309787), and a method for performing a plasma treatment in an ammonia gas atmosphere (e.g., R&D Reviews of Mitsubishi Cable Industries, Ltd., July 2007, pp. 78-84). As for the injection-molded article supplied to a plasma treatment apparatus, the inner surface of the injection-molded article, which will surround a wafer, can be subjected to a plasma irradiation treatment by plasma gas generated between the inside of the injection-molded article and the discharge electrodes by applying a voltage across the discharge electrodes while introducing gas into the gap between the injection-molded article and the discharge electrodes. At this time, the plasma treatment may be performed on the entirety of the inner surface of the injection-molded article, the plasma treatment may be performed on a part of the inner surface of the injection-molded article, and the plasma treatment may be performed on a portion to which water or a chemical solution scatting from the wafer may adhere. The plasma treatment may be performed in a discharge container provided with external electrodes, may be a direct type using dielectric discharge, or may be a remote type in which a plasma-activated gas is blown in a jet-like manner.

Embodiments have been described above, but it will be understood that various changes to forms and details can be made without departing from the gist and the scope of the claims.

EXAMPLES

Next, embodiments of the present disclosure will now be described by way of Examples, but the present disclosure is not limited solely to the Examples.

The numerical values of the Examples were measured by the following methods.

(Melting Point)

The melting point was obtained as a temperature corresponding to the maximum value in a heat-of-fusion curve obtained when the temperature was raised at a rate of 10° C./min using a differential scanning calorimeter [DSC].

(MFR)

The mass (g/10 min) of a polymer flowing out from a nozzle having an inner diameter of 2.1 mm and a length of 8 mm in 10 minutes using a melt indexer (manufactured by Yasuda Seiki Seisakusho Ltd.) at 372° C. under a load of 5 kg was obtained in accordance with ASTM D 1238.

(Content of Monomer Unit) The content of each monomer unit was measured by $^{19}$F-NMR method.

(Number of Functional Groups)

A sample is melted at 330 to 340° C. for 30 minutes and compression-molded to create a film having a thickness of 0.25 to 0.3 mm. This film is analyzed by being scanned 40 times with a Fourier transform infrared spectrometer [FT-IR (trade name: Model 1760X manufactured by PerkinElmer Co., Ltd.)] to obtain an infrared absorption spectrum and obtain a spectral difference from a base spectrum of a completely fluorinated copolymer having no functional group. From the absorption peak of a specific functional group appearing in this spectral difference, the number N of functional groups per $1 \times 10^6$ carbon atoms in the sample is calculated according to the following formula (A).

$$N = I \times K / t \quad (A)$$

I: Absorbance
K: Correction coefficient
t: Film thickness (mm)

For reference, Table 2 shows the absorption frequencies, molar absorption coefficients, and correction coefficients of functional groups in the present disclosure. The molar adsorption coefficients are determined from the FT-IR measurement data of a low molecular weight model compound.

[Table 2]

TABLE 2

| Functional Group | Absorption Frequency (cm$^{-1}$) | Molar Extinction Coefficient (l/cm/mol) | Correction Factor | Model Compound |
|---|---|---|---|---|
| —COF | 1883 | 600 | 388 | C$_7$F$_{15}$COF |
| —COOH free | 1815 | 530 | 439 | H(CF$_2$)$_6$COOH |
| —COOH bonded | 1779 | 530 | 439 | H(CF$_2$)$_6$COOH |
| —COOCH$_3$ | 1795 | 680 | 342 | C$_7$F$_{15}$COOCH$_3$ |

TABLE 2-continued

| Functional Group | Absorption Frequency (cm$^{-1}$) | Molar Extinction Coefficient (l/cm/mol) | Correction Factor | Model Compound |
|---|---|---|---|---|
| —CONH$_2$ | 3436 | 506 | 460 | C$_7$H$_{15}$CONH$_2$ |
| —CH$_2$OH, —OH | 3648 | 104 | 2236 | C$_7$H$_{15}$CH$_2$OH |
| —CF$_2$H | 3020 | 8.8 | 26485 | H(CF$_2$CF$_2$)$_3$CH$_2$OH |
| —CF=CF$_2$ | 1795 | 635 | 366 | CF$_2$=CF$_2$ |

(Water Contact Angle)

The water contact angle was measured at room temperature with a contact angle meter (FACE CONTACT ANGLE METER MODEL CA-D manufactured by Kyowa Interface Science Co., Ltd.).

Concerning the plasma-irradiated molded articles, the water contact angles of the plasma irradiation-treated surfaces of the molded articles one day after plasma irradiation were measured.

(Electrification Amount)

Figure 2:
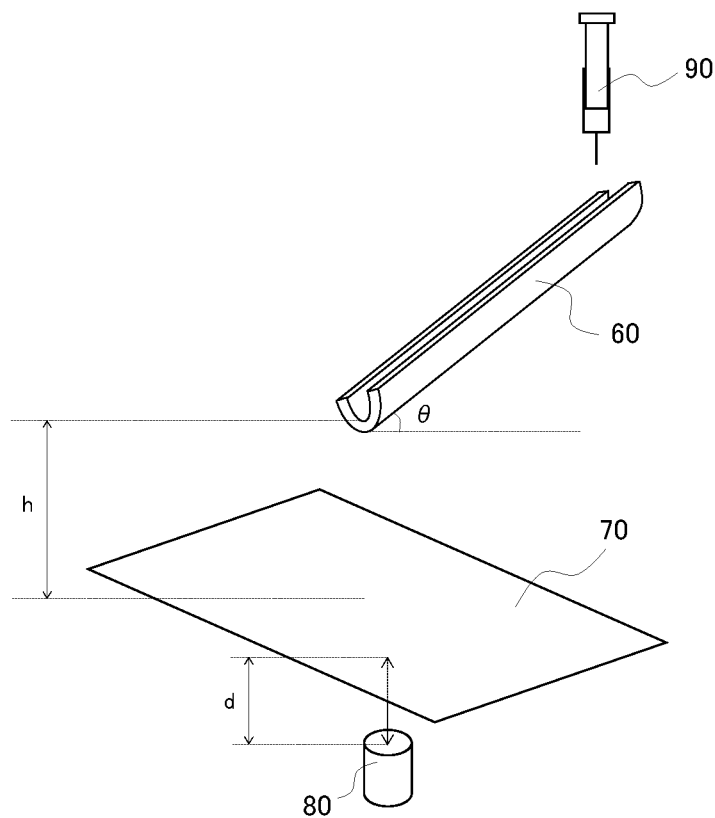
FIG. 2 is a drawing for explaining the evaluation method in the Examples of the present disclosure.

A tubular molded article was cut in half in the longitudinal direction to give a halved tube having a length of 50 mm, and as shown in FIG. 2, a halved tube 60 was tilted so as to have angle θ=60° such that the height h of the lower end was 70 mm from an aluminum plate 70 that had 120 mm length×120 mm width×1.5 mm thickness and was insulated from the ground. Then, as shown in FIG. 2, pure water was dripped one droplet at a time for a total of 10 droplets with a syringe 90 into the groove at the upper end of the halved tube 60 under a condition of 50 μL/droplet.

Due to this operation, the dripped droplets, while flowing down the groove of the halved tube 60, negatively charge the halved tube 60 by triboelectrification and peeling electrification and, at the same time, the droplets falling down from the halved tube 60 are positively charged. Due to the positively charged droplets that fell to the aluminum plate 70, free electrons in the aluminum plate 70 move toward the surface to which the droplets fell (the upper surface in FIG. 2), and, as a result, the back surface (the lower surface in FIG. 2) side of the aluminum plate 70 becomes positively charged by electrostatic induction. By measuring the electrical potential on the back surface side of the aluminum plate 70 at this time with a digital low potential measuring device (KSD-3000 manufactured by Kasuga Denki Inc.), the electrification amount of the halved tube 60 can be determined. That is to say, if the total electrification amount of 10 droplets is +Q, the aluminum plate 70 insulated from the ground receives an electrical charge of +Q and, at this time, since the absolute value of the electrification potential is the same, the electrification amount of the surface of the halved tube 60 is −Q. Accordingly, by measuring the electrical potential of the aluminum plate 70, the electrical potential and the electrification amount of the halved tube 60 can be determined. To measure the electrical potential of the aluminum plate 70, a probe 80 was used that was provided on the back surface (the opposite surface to the surface onto which droplets were dripped) side of the aluminum plate 70 at distance d=10 mm from the aluminum plate 70.

In Comparative Example 3 and Example 5, sheet-like molded articles were used in place of the halved tube 60 to measure the electrification amount as described above.

In the present examples, the electrification amount was measured with the halved tube 60 and sheet-like molded articles, but it can be said that the electrification amount is not dependent on the shape of molded articles.

(Rate of Decrease in Electrification Amount)

From the result of measuring the electrification amount, the rate of decrease in electrification amount was calculated according to the following formula:

Rate of decrease in electrification amount (%)= (Electrification amount/Electrification amount of untreated article)×100

In Comparative Examples 1 and 2 and Examples 1 to 4, the results of Comparative Example 1 were used for an untreated article, and in Comparative Example 3 and Example 5, the results of Comparative Example 3 were used for an untreated article.

Comparative Example 1

TFE/PPVE copolymer 1 (composition ratio (% by mass) of TFE to PPVE: TFE/PPVE=96.5/3.5), melting point: 308° C., MFR: 2.0 g/10 min, number of functional groups: 6 (per $10^6$ C)) was molded with a tube extruder to obtain a tubular molded article having an outer diameter of 12 mm and an inner diameter of 10 mm. The physical properties of the obtained tubular molded article were evaluated. The results are shown in Table 3.

Comparative Example 2

A tubular molded article obtained in the same manner as in Comparative Example 1 was inserted into double helix electrodes (a high frequency power source having 13.56 MHz) of an atmospheric pressure plasma treatment apparatus, a mixed gas of oxygen and argon (a volume ratio of oxygen to argon ($O_2$/Ar) of 1/100) was continuously introduced into the tubular molded article at a gas flow rate of 300 cc/min, power having a power density of 20 W/cm² was applied, and thus a plasma treatment was performed for 3 seconds.

Various physical properties of the tubular molded article after the plasma treatment were evaluated. The results are shown in Table 3. While a method involving double helix electrodes was employed in this example, a method according to the shape and size of a molded article can be employed.

Examples 1 to 4

A plasma treatment was performed in the same manner as in Comparative Example 2 except that the plasma treatment conditions were changed as shown in Table 3, and various physical properties of the tubular molded article after the plasma treatment were evaluated. The results are shown in Table 3.

Comparative Example 3

TFE/PPVE copolymer 2 (composition ratio (% by mass) of TFE to PPVE: TFE/PPVE=95.5/4.5), melting point: 306° C., MFR: 13.0 g/10 min, number of functional groups: 484 (per $10^6$ C)) was molded with a heat-press molding machine to obtain a sheet-like molded article having 50 mm per side and a thickness of 1 mm. The physical properties of the obtained sheet-like molded article were evaluated. The results are shown in Table 3.

Example 5

A sheet-like molded article obtained in the same manner as in Comparative Example 3 was heated to 190° C. by an external heating means, then placed in a vacuum plasma treatment apparatus (a high frequency power source having 13.56 MHz) equipped with a pair of mutually parallel electrodes, ammonia gas was continuously introduced into the treatment apparatus at a gas flow rate of 20 cc/min such that the pressure in the treatment apparatus was maintained at 5.5 Pa, power having a power density of 20 W/cm² was applied, and thus a plasma treatment was performed for 20 seconds.

Various physical properties of the sheet-like molded article after the plasma treatment were evaluated. The results are shown in Table 3.

TABLE 3

|  | Comparative Example 1 | Comparative Example 2 | Example 1 | Example 2 | Example 3 | Example 4 | Comparative Example 3 | Example 5 |
|---|---|---|---|---|---|---|---|---|
| Material used | Copolymer 1 | Copolymer 1 | Copolymer 1 | Copolymer 1 | Copolymer 1 | Copolymer 1 | Copolymer 2 | Copolymer 2 |
| Plasma treatment conditions | | | | | | | | |
| Pressure | Not treated | Atmospheric pressure | Atmospheric pressure | Atmospheric pressure | Atmospheric pressure | Atmospheric pressure | Not treated | Vacuum |
| Type of gas |  | $O_2$/Ar | $O_2$/Ar | $O_2$/Ar | $O_2$/Ar | $O_2$/Ar |  | $NH_3$ |
| Volume ratio of gas |  | 1/100 | 1/100 | 1/100 | 1/100 | 1/100 |  | — |
| Treatment time (seconds) |  | 3 | 10 | 20 | 25 | 45 |  | 20 |
| Physical properties of molded article after plasma treatment | | | | | | | | |
| Water contact angle (degrees) | 104 | 102 | 52 | 55 | 57 | 75 | 105 | 52 |
| Electrification amount (kv) | 0.20 | 0.19 | 0.01 | 0.03 | 0.03 | 0.10 | 0.21 | 0.01 |
| Rate of decrease in electrification amount (%)[*] | 100 | 97 | 7 | 13 | 16 | 49 | 100 | 7 |

[*] Rate of decrease in electrification amount is electrification amount relative to not plasma treated (i.e., Rate of decrease in electrification amount (%) = (Electrification amount/Electrification amount of untreated article) × 100

REFERENCE SIGNS LIST

10 Wafer cup
20 Rotation mechanism
30 Wafer spin base
40 Wafer
50 Nozzle

The invention claimed is:

1. A wafer cup comprising a copolymer comprising a tetrafluoroethylene unit and a fluoro(alkyl vinyl ether) unit, wherein
   a water contact angle of at least a part of an inner surface of the wafer cup is 40 degrees or more and 80 degrees or less, and a content of the fluoro(alkyl vinyl ether) unit in the copolymer is 3.5 to 7.0% by mass based on all monomer units.

2. The wafer cup according to claim 1, wherein a melt flow rate of the copolymer at 372° C. is 1 to 30 g/10 min.

3. The wafer cup according to claim 1, wherein the wafer cup is a molded article to be used in an application for surrounding a wafer in a wafer treating apparatus in which water or a chemical solution is fed to a wafer while rotating the wafer.

* * * * *